(12) United States Patent
Mitrovic et al.

(10) Patent No.: US 7,017,652 B2
(45) Date of Patent: Mar. 28, 2006

(54) METHOD AND APPARATUS FOR TRANSFERRING HEAT FROM A SUBSTRATE TO A CHUCK

(75) Inventors: Andrej J. Mitrovic, Phoenix, AZ (US); Lianjun Liu, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/639,510

(22) Filed: Aug. 13, 2003

(65) Prior Publication Data

US 2004/0043639 A1    Mar. 4, 2004

Related U.S. Application Data

(63) Continuation of application No. PCT/US02/02816, filed on Feb. 4, 2002.

(60) Provisional application No. 60/268,913, filed on Feb. 16, 2001.

(51) Int. Cl.
*F28F 7/00* (2006.01)

(52) U.S. Cl. .................. 165/80.2; 156/345.1; 118/725; 118/728; 361/234

(58) Field of Classification Search ...... 165/80.1–80.5; 156/345; 118/724, 728, 725; 361/234
See application file for complete search history.

(56) References Cited

U.S. PATENT DOCUMENTS

| | | | | |
|---|---|---|---|---|
| 1,145 | A | * | 5/1839 | Anderson .................. 105/166 |
| 4,184,188 | A | * | 1/1980 | Briglia ........................ 361/234 |
| 4,603,466 | A | | 8/1986 | Morley |
| 5,001,423 | A | | 3/1991 | Abrami et al. |
| 5,155,652 | A | * | 10/1992 | Logan et al. ............... 361/234 |
| 5,160,152 | A | * | 11/1992 | Toraguchi et al. .......... 279/128 |
| 5,201,847 | A | | 4/1993 | Whidden |
| 5,374,594 | A | | 12/1994 | van de Ven et al. |

(Continued)

FOREIGN PATENT DOCUMENTS

EP    0 467 623 B1    3/1996

(Continued)

OTHER PUBLICATIONS

Wang et al., "A technique for measuring convective heat transfer at rough surfaces," Transactions of Institute of Measurement and Control, vol. 13 (No. 3), p. 45-154, (1991).

(Continued)

*Primary Examiner*—Terrell McKinnon
(74) *Attorney, Agent, or Firm*—Pillsbury Winthrop Shaw Pittman LLP (57) ABSTRACT

A chuck method of and apparatus (50, 150, 300) for supporting a substrate (W) during processing of the substrate, where the substrate has a lower surface ($W_L$). The apparatus facilitates heat transfer away from the substrate during processing of the substrate. The apparatus comprises a chuck body (60) having an outer edge (70) and a rough upper surface ($64_U$). The substrate is arranged adjacent the rough surface such that the substrate lower surface and the roughened upper surface form a gap (100) therebetween. The apparatus further includes a central gas conduit (80) passing through the chuck body. The central conduit has a second end (82b) open to the roughened upper surface and a first end opposite the second end connected to a gas source (86). The conduit is arranged such that a gas can flow through the conduit into the gap and toward the chuck body outer edge. The gas used has an atomic or molecular weight that is greater than that of helium. The surface roughness, the substrate lower surface and the flow of the heavier gas in the gap contribute to defining an accommodation coefficient $\alpha$ and a mean free path $\lambda$ such that the ratio $\alpha/\lambda$ is higher than that of prior art apparatus.

54 Claims, 6 Drawing Sheets

U.S. PATENT DOCUMENTS

| | | | | |
|---|---|---|---|---|
| 5,460,684 A * | 10/1995 | Saeki et al. | ............. | 156/345.51 |
| 5,478,429 A * | 12/1995 | Komino et al. | ........ | 156/345.44 |
| 5,511,608 A * | 4/1996 | Boyd | ........................ | 165/80.1 |
| 5,530,616 A * | 6/1996 | Kitabayashi et al. | ........ | 361/234 |
| 5,531,835 A * | 7/1996 | Fodor et al. | ................ | 118/728 |
| 5,581,874 A * | 12/1996 | Aoki et al. | .................... | 29/825 |
| 5,583,736 A * | 12/1996 | Anderson et al. | ........... | 361/234 |
| 5,583,737 A | 12/1996 | Collins et al. | | |
| 5,591,269 A | 1/1997 | Arami et al. | | |
| 5,609,720 A | 3/1997 | Lenz et al. | | |
| 5,675,471 A * | 10/1997 | Kotecki | ....................... | 361/234 |
| 5,761,023 A | 6/1998 | Lue et al. | | |
| 5,810,933 A * | 9/1998 | Mountsier et al. | .......... | 118/724 |
| 5,822,172 A | 10/1998 | White | | |
| 5,846,375 A * | 12/1998 | Gilchrist et al. | ....... | 156/345.52 |
| 5,856,906 A | 1/1999 | Kholodenko et al. | | |
| 5,936,829 A | 8/1999 | Moslehi | | |
| 6,099,652 A | 8/2000 | Patten, Jr. et al. | | |
| 6,102,113 A * | 8/2000 | Cowans | ....................... | 165/206 |
| 6,183,523 B1 | 2/2001 | Hurwitt et al. | | |
| 6,447,853 B1 * | 9/2002 | Suzuki et al. | ................ | 427/585 |
| 6,544,338 B1 * | 4/2003 | Batchelder et al. | ......... | 118/641 |
| 6,628,503 B1 * | 9/2003 | Sogard | ........................ | 361/324 |

FOREIGN PATENT DOCUMENTS

| | | |
|---|---|---|
| GB | 2 320 929 A | 7/1998 |
| TW | 85102046 | 3/1997 |
| WO | WO 01/04945 A1 | 1/2001 |

OTHER PUBLICATIONS

Wright et al., "Low temperature etch chuck: modeling and experimental results of heat transfer and wafer temperature," J. Vac. Sci. Technol, 1 st ed., American Vacuum Society, vol. 10 (No. 4), p. 1065-1070, (1992).

Madhusudana, "Thermal Contact Conductance," Springer-Verlag, Inc. (New York), p. 23-63, (1996).

Oberg et al., "Machinery's Handbook," 4th ed., Industrial Press Inc. (New York), p. 666-679, (1992).

Wolf et al., "Silicon Processing for the VLSI Era, vol. 1: Process Technology," Lattice Press (Sunset Beach, CA), p. 27, (1986).

Van Zant, "Microchip Fabrication: A Practical Guide to Semiconductor Processing," 4th ed., McGraw-Hill (New York), p. 64, (2000).

* cited by examiner

FIG. 1

(PRIOR ART)

METHOD AND APPARATUS FOR TRANSFERRING HEAT FROM A SUBSTRATE TO A CHUCK

This is a Continuation of International Application PCT/US02/02816, filed on Feb. 4, 2002, which, in turn, claims the benefit of U.S. Provisional Application No. 60/268,913, filed Feb. 16, 2001, the contents of both of which are hereby incorporated by reference.

BACKGROUND OF THE INVENTION

1. Field of the Invention

The present invention pertains to a method and apparatus for transferring heat from a substrate to a chuck that supports the substrate.

2. Discussion of the Background

There is a never-ending demand for increasing throughput in semiconductor, display and other types of substrate manufacturing. Many of the processes in substrate processing involve placing the substrate, such as a semiconductor wafer, on a chuck and processing the substrate. During certain of these processes, the substrate heats up, and this heat needs to be dissipated quickly. Quick heat dissipation allows the substrate temperature to be maintained within certain limits determined for the process even at high processing tool power levels, and the quick initiation of the next process step. Both of these allow a high process throughput, which drives down the process cost per substrate.

One process used with substrates, such as in the fabrication of semiconductor devices (e.g., integrated circuits, or "ICs") or displays, involves subjecting the substrate to a plasma for depositing material onto or etching material from the substrate surface. During this process, high-energy plasma particles bombard the substrate, and generate a large amount of heat, which is absorbed by the substrate. This heat needs to be quickly transferred from the substrate to the chuck and then quickly dissipated from the chuck, so that the substrate is kept at a steady temperature. If the transfer of heat from substrate to chuck, or the heat dissipation from the chuck itself is inefficient or inadequate, the temperature of the substrate increases rapidly. The accumulation of heat in the substrate can damage structures on the substrate (e.g., excess heat can cause unwanted diffusion of dopants in a semiconductor substrate, which can lead to leakage currents in transistors). This thermal buildup also impacts tool throughput because in the absence of an effective heat transfer mechanism, the plasma process needs to be operated at a lower power level or in an interrupted manner (to allow the substrates to cool) to achieve adequate process yield (e.g., fewer damaged devices). Control of substrate heating during plasma processing is also important because the substrate temperature affects the etch process itself (e.g., etch selectivity to photoresist, etc.).

Figure 1:
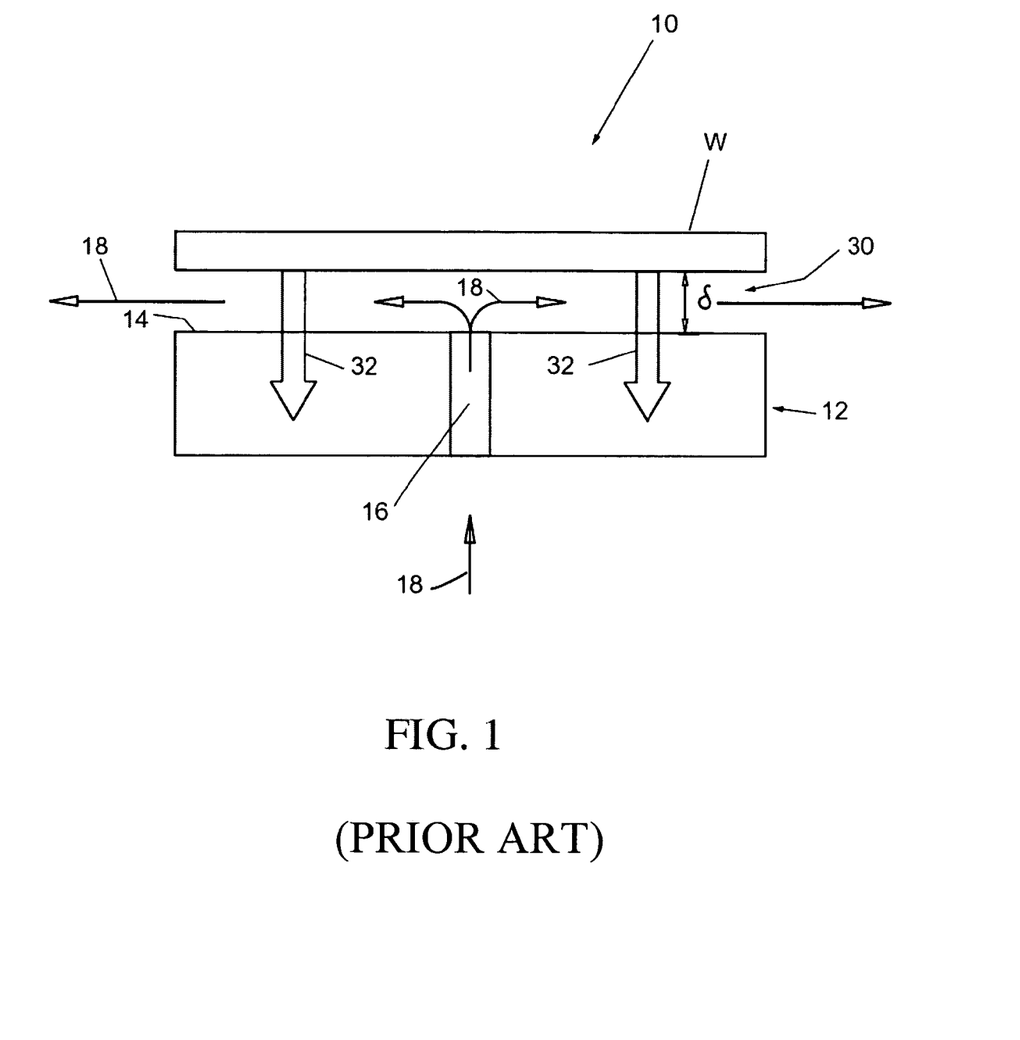
FIG. 1 is a cross-sectional schematic diagram of a prior art chuck apparatus, showing the flow of helium gas used to cool the substrate supported by the chuck.

FIG. 1 is a schematic diagram of a prior art chuck apparatus 10 for supporting a substrate W in a low-pressure environment. Chuck 10 includes a chuck body 12 with an upper surface 14 and a conduit 16 formed within the chuck body that leads from a helium gas source (not shown) to surface 14. During substrate processing, helium gas 18 is fed into conduit 16 and flows toward substrate W. Because of the low-pressure environment above the wafer, the helium gas 18 introduced between the wafer and chuck, and the roughness of chuck surface 14, a gas gap forms between chuck surface 14 and the lower surface of substrate W. This gap separates the substrate and the chuck body by a low-pressure gas gap 30 having a mean gap width $\delta$, which is typically a few micrometers wide. In this sense, substrate W is exposed to helium gas 18 flowing between chuck upper surface 14 and substrate W lower surface. The helium gas injected into gap 30 flows outwards to the outer edge of substrate W, its presence in the gap 30 thereby allowing the transfer of heat away from the substrate to the chuck (as indicated by arrows 32). This heat transfer mechanism is known as low-pressure gas gap conduction and is widely used in the semiconductor industry. Helium gas is used to effectuate the heat transfer because it is inert and has a high thermal conductivity (only hydrogen has a higher thermal conductivity).

Unlike the case of heat conduction in normal atmospheric (e.g. high) pressure conditions, under low pressure conditions, the extent of gas-surface energy exchange (and, hence, the effectiveness of cooling) is characterized by the so-called accommodation coefficient $\alpha$, in addition to the gas thermal conductivity.

Low-pressure (i.e., of the order of 10 to 50 Torr or less) gas gap conduction is used for cooling in many types of substrate processing equipment. For instance, in most etch tools, there is a gap between the substrate and the lower electrode. This gap is filled with low-pressure helium or argon and is used to cool the substrate. To guide the helium or argon flow in a certain direction, various channels on the upper surface of the chuck or on the backside of the substrate may be used.

The heat flux q" of thermal conduction for a low-pressure gas gap between a substrate and a chuck is given by the product of the heat transfer coefficient $h_g$ and the temperature difference $\Delta T = T_w - T_c$ between the proximate surfaces of the substrate and the chuck, or $q'' = h_g \Delta T$. In general, the chuck temperature is controlled by its cooling system. The substrate temperature, on the other hand, is constrained by the desire to maintain a high process yield and by the type of devices being fabricated on the substrate. For a given process and device type, this essentially fixes the temperature difference $\Delta T$.

BRIEF SUMMARY OF THE INVENTION

The present invention pertains to methods and apparatus for transferring heat from a substrate to a chuck that supports the substrate.

The present invention utilizes a chuck upper surface that is rough and may optionally utilize a gas having an atomic/molecular weight larger than argon. For example, the surface may have a roughness (Ra) of 0.4 µm or more. Alternatively, the roughness (Ra) may be between 0.4 and about 10 µm or about 1 to about 4 µm. The roughness may be such that the temperature difference between the chuck upper surface and the substrate may be within 5 percent, 2 percent or 1 percent of the minimum, or at the minimum. The roughness may be such that the ratio of accommodation coefficient $\alpha$ to the gas mean free path $\lambda$ is at a maximum, or within 1 percent, 2 percent or 5 percent of the maximum. The present invention may optionally include providing a substrate having a lower surface with a surface roughness, e.g., a Ra of 1 µm or more.

Accordingly, a first aspect of the invention is a chuck apparatus for supporting a substrate having an upper and lower surface and for facilitating heat transfer away from the substrate during processing of the upper surface of the substrate. The apparatus comprises a chuck body having an outer edge and a roughened upper surface. The substrate, which can be a silicon wafer, display substrate or the like, is arranged adjacent the roughened surface such that the substrate lower surface and the roughened chuck body upper surface form a gap therebetween. The apparatus further includes a gas conduit passing through the chuck body. The conduit has a first end open to the roughened upper surface and a second end opposite said first end. The conduit is arranged such that a gas can flow through the conduit from a gas source and into the gap and toward the chuck body outer edge.

A second aspect of the invention is the apparatus as described above, but having different regions of surface roughness on the upper surface.

A third aspect of the invention is the apparatus as described above, having a plurality of gas holes which can be connected to different gas sources that allow different types of gas to be injected into different zones within the gap, thereby providing for spatially varying amounts of heat transfer. A multi-channel gas mixer can be used to efficiently mix the gases and also inject the gas (mixed or otherwise) into the gap. In addition, a main control unit electronically connected to the different gas sources and the multi-channel gas mixer allows for dynamically changing the flow of gas (or gases) into the gap to adjust the heat transfer from the substrate to the chuck body.

A fourth aspect of the invention is a method facilitating the transfer of heat from the substrate to the chuck body. The method comprises the steps of first, providing the upper surface with a rough surface. This surface roughness may be uniform across the surface, or may vary spatially in the form of different regions. Alternatively, the surface roughness may vary smoothly as a function of position, e.g., radially outwardly decreasing from the center of the surface. The next step is forming a gap between the roughened upper surface and the substrate lower surface by arranging the substrate adjacent the roughened surface. The last step then involves flowing at least one gas into said gap such that the gas flows towards the outer edge. The gas (which may be a gas mixture) flowing through the gap may have an atomic or molecular weight greater than that of argon, and thus a higher ratio $\alpha/\lambda$, where $\alpha$ is the accommodation coefficient of the surface and $\lambda$ is the gas mean free path.

DETAILED DESCRIPTION OF THE INVENTION

The present invention pertains to methods and apparatus for transferring heat from a substrate to a chuck that supports the substrate.

To increase the amount of heat transfer from a substrate to a chuck body in a chuck apparatus, the heat transfer coefficient $h_g$ can be increased. At low pressures, the heat transfer coefficient $h_g$ is actually a fairly complex function of a number of other parameters, including the atomic and/or molecular sizes of the gas and solid surfaces, the pressure of the gas used, and the conditions of the surfaces (e.g., roughness or contamination) that define the gap.

Figure 2:
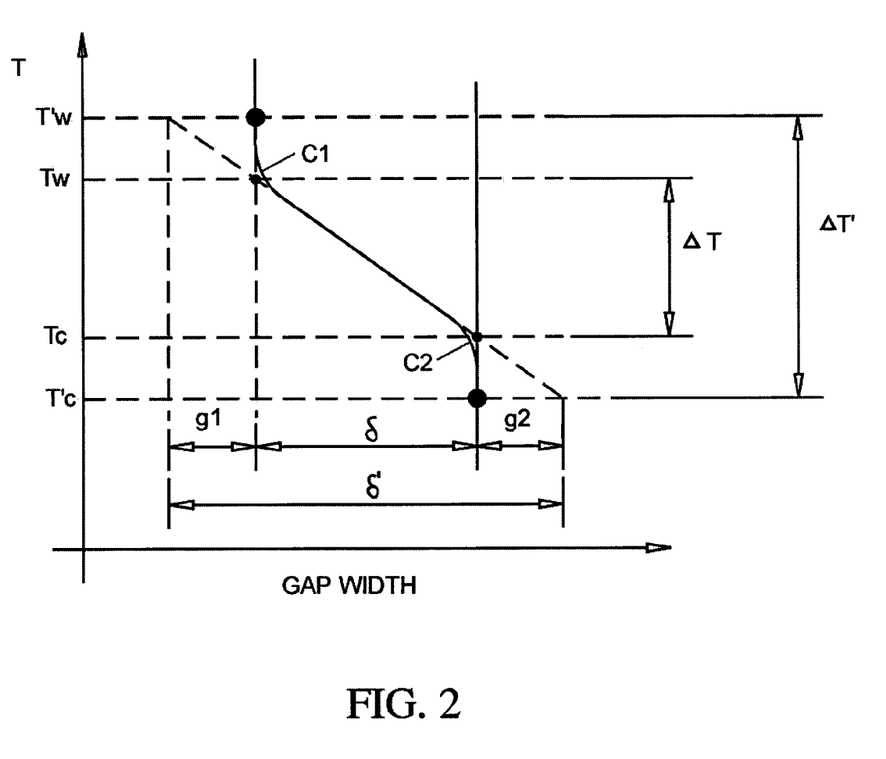
FIG. 2 is a plot of the known relationship between temperature T and gap width, illustrating the effective thickness of the gas gap and the temperature profile in the gap between the substrate and the chuck.

To account for the above effects on the heat transfer coefficient $h_g$, an effective gap width $\delta'$ that is greater than the physical mean gap width $\delta$ is introduced. FIG. 2 shows the known manner in which the effective thickness $\delta'$ of the gas gap relates to the physical gas gap width $\delta$ and the temperature T within the gap. When the gas pressure is large and $\delta \gg \lambda$, where $\lambda$ is the gas mean free path (i.e., the average distance between collisions between gas atoms or molecules), the temperature is a linear function of position between the surfaces comprising the gap of thickness $\delta$. Under these conditions the temperature difference is $\Delta T$, the slope of the temperature profile curve is $\Delta T/\delta$, and the heat flux is $q''=h_g\Delta T=k\Delta T/\delta$. However, if the pressure in the gas gap is lowered to a value such that $\delta \sim \lambda$, or $\delta < \lambda$, which is the case for typical substrate chuck gas gaps, and the heat flux $q''$ is kept the same, the temperature difference $\Delta T'$ becomes much larger, as shown by curves C1 and C2. The phenomenon of deviation of the temperature profile in the vicinity of solid walls from a linear profile is called "temperature jump." It is a result of the effects of solid walls and gas atomic and/or molecular weights, wall surface roughness, and low gas pressure, which all reduce the heat transfer coefficient.

With continuing reference to FIG. 2, the effective length of the heat transfer path also increases due to temperature jumps (i.e., steep temperature gradients), resulting in an effective gas gap width of $\delta'=\delta+g_1+g_2$, where $g_1$ and $g_2$ are called "temperature jump distances." The size of temperature jump distances $g_i$ depends on the accommodation coefficient $\alpha_i$ at each gas-solid interface. The accommodation coefficient is defined as $\alpha=[T_{scat}-T_g]/[T_s-T_g]$, where $T_s$ is the solid surface temperature, $T_g$ is the gas temperature before collision, and $T_{scat}$ is the temperature of the gas scattered after collision with the solid surface. Heat transfer is most efficient when $T_{scat}=T_s$, which means that the gas "fully accommodates" its temperature to that of the solid wall. In this case, $\alpha=1$. In general, $\alpha<1$ and can be anywhere between 0.01 and 1.0, depending on the gas pressure, the gas and solid wall chemical species atomic and/or molecular weights, and the conditions of the solid surface (e.g. roughness and contamination).

Lighter, monatomic gases have smaller accommodation coefficients; molecular gases have larger accommodation coefficients; up to a point, clean or smooth surfaces have lower accommodation coefficients than contaminated or rough surfaces. After some manipulation, in the limit of low pressure when $\lambda \gg \delta$, temperature jump distances can be shown to approximately be $g_i \approx \lambda/\alpha$, and the effective gas gap width becomes $\delta' \approx 2\lambda/\alpha$. The heat transfer coefficient (conductance) now becomes $h_g=k_g/\delta' \approx k\alpha/2\lambda$, no longer a simple function of gas conductivity $k_g$, but also a very strong function of the ratio $\alpha/\lambda$. Indeed, it has been found that the ratio $\alpha/\lambda$ for some gases with low conductivity $k_g$ compared to helium, in the presence of solid surfaces of certain roughness, and at certain pressures, is such that it makes the overall heat transfer coefficient $h_g$ greater than that of helium under similar gap conditions (e.g., gap distance and gas pressure).

First Embodiment

Figure 3:
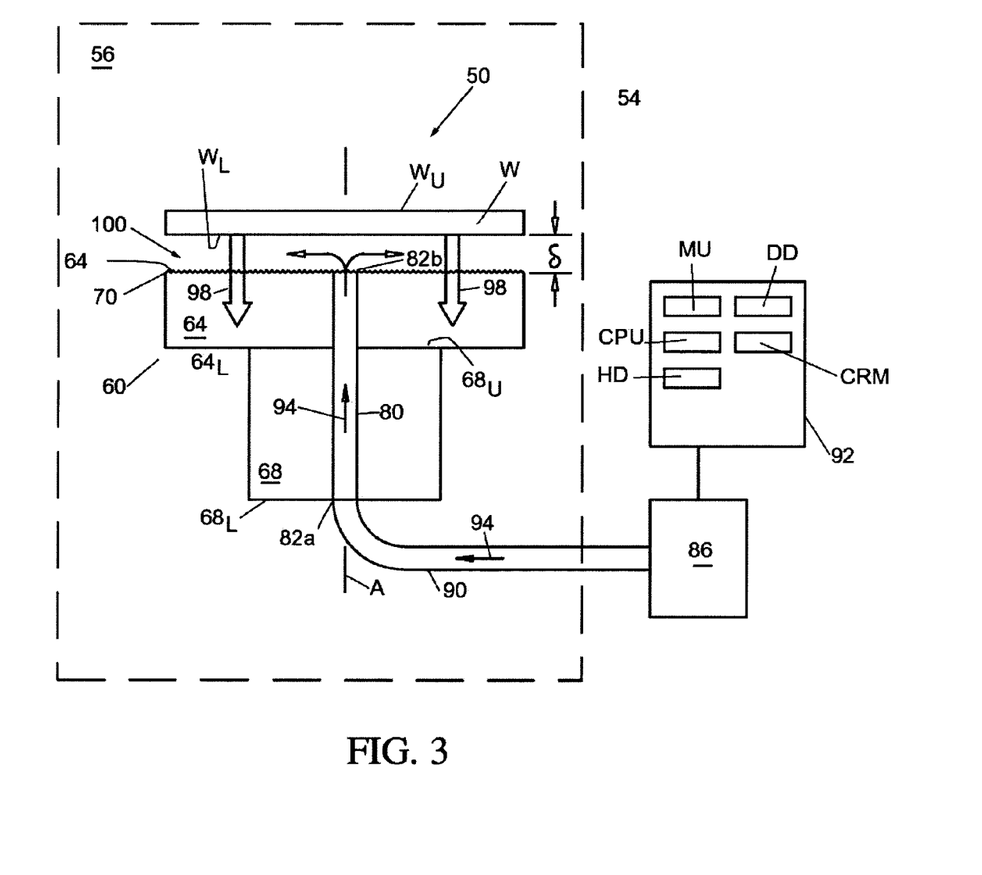
FIG. 3 is a cross-sectional schematic diagram of a chuck apparatus according to a first embodiment of the present invention.

With reference to FIG. 3, there is shown a first embodiment of a chuck apparatus 50 for supporting a substrate W with a lower surface $W_L$ and an upper surface $W_U$, for providing enhanced gap conduction of heat during substrate processing. In a preferred embodiment of the present invention, lower surface $W_L$ is optionally roughened to enhance the effects described below. For example, lower surface $W_L$ may be roughened so that the average roughness Ra, as defined by ANSI standard ANSI-B46.1-1985, may be 1 μm or more. Chuck apparatus 50 is in a low-pressure environment, such as within a chamber 54 having an evacuated interior region 56. Chuck apparatus 50 comprises a chuck body 60. Chuck body 60 has upper portion 64 with a rough upper surface $64_U$ and a lower surface $64_L$, and may possibly, but not necessarily, have a base portion 68 depending from lower surface $64_L$ and having an upper end $68_U$ and a lower end $68_L$. Upper surface $64_U$ may have a roughness Ra, as defined by ANSI standard ANSI-B46.1-1985, of 0.4 μm or more. The roughness Ra of upper surface $64_U$ may be 0.4 to about 10 μm or about 1 to about 4 μm. Upper portion 64 and base portion 68 may be cylindrical or any other shape. Base portion 68 is typically narrower and more elongate than upper portion 64, so that chuck body 60 has a T-shaped cross-section with a central axis A. Base portion 68 may be a separate member attached to lower surface $64_L$, or may be integral with upper portion 64. The latter has an outer edge 70. Chuck body 60 (or at least upper portion 64) is typically made of aluminum, stainless steel, or other materials compatible with the chamber process, and that are good heat conductors. Upper surface $64_U$ is also referred to herein generally as the "chuck body upper surface."

Chuck body 60 further includes a central gas conduit 80 which may be aligned along central axis A and pass through upper cylindrical portion 64 and lower cylindrical portion 68. Alternately, portion 64 and/or portion 68 may be non-cylindrical. Conduit 80 has a first end 82a open at lower end $68_L$ and a second end 82b open to upper surface $64_U$.

Chuck apparatus 50 also comprises a gas source 86 connected to gas conduit 80 at first end 82a via a gas line 90. Gas source 86 is shown to be exterior to chamber 54, but may be interior.

Chuck apparatus also may include a main control unit 92 electronically connected to gas source 86 and is used to dynamically control the delivery of gas from the gas source to control the heat transfer process. In one embodiment, main control unit 92 is a computer having a memory unit MU with both random-access memory (RAM) and read-only memory (ROM), a central processing unit CPU (e.g., PENTIUM™ processor from Intel Corporation), and a hard disk HD, all electronically connected. Hard disk HD serves as a secondary computer-readable storage medium, and may be, for example, a hard disk drive for storing information corresponding to instructions for the main control unit to control the uniformity of the substrate temperature via control of the heat transfer, as described below. Main control unit 92 also may include a disk drive DD, electronically connected to hard disk HD, memory unit MU and central processing unit CPU, wherein the disk drive is capable of accepting and reading (and even writing to) a computer-readable medium CRM, such as a floppy disk or compact disk (CD), on which is stored information corresponding to instructions for main control unit 92 to carry out the present invention. It is also preferable that main control unit 92 have data acquisition and control capability. Main control unit 92 may comprise a computer, such as a DELL PRECISION WORKSTATION 610™, available from Dell Corporation, Dallas, Tex. and a number of peripherals.

Lower surface $W_L$ of substrate W is arranged adjacent upper surface $64_U$ during processing. Gas 94 from gas source 86 flows through central gas conduit 80 from first end 82a to second end 82b and then flows between substrate lower surface $W_L$ and upper surface $64_U$ towards outer edge 70. The flow of gas 94 in the low-pressure environment of interior region 56 results in the formation of a low-pressure gap 100 of width δ between substrate lower surface $W_L$ and upper surface $64_U$ of chuck body 60.

As discussed above, the larger the ratio α/λ, the larger the heat transfer coefficient, and, therefore, the larger the heat flux between substrate W and upper cylindrical portion 64 of chuck body 60 through gap 100. The heat flux is illustrated by arrows 98. The flow of gas 94 into gap 100 can be dynamically controlled by main control unit 92 to control the heat transfer between substrate W and chuck body 60.

The surface roughness of upper surface $\Gamma_U$ may be selected so that the ratio α/λ, of the accommodation coefficient α to the mean free path λ of the gas has a maximum value, or is within 1 percent, 2 percent or 5 percent of the maximum. The amount of surface roughness affects the efficiency of the exchange of energy between the gas atoms/molecules and the substrate and chuck surfaces. The interaction of the gas atoms/molecules with a rough surface is more like an inelastic collision as compared to that with a smooth surface, which means more energy is exchanged between the gas atoms/molecules and the surfaces. Thus, the use of one or more roughened surfaces (i.e., on upper surface $64_U$ and/or lower surface $W_L$) increases the accommodation coefficient α, thereby increasing the ratio α/λ. The result is a more efficient exchange of heat between the gas molecules and the substrate and chuck surfaces. The surface roughness can be uniform across upper surface $64_U$, can comprise various regions of surface roughness (discussed further below), or can vary smoothly (e.g., radially outwardly decreasing, or increasing, from central axis A).

The amount of surface roughness depends on the gas that is being used. In prior art chucks, the top surfaces 14 are typically mirror polished, which means the roughness is generally less than 0.1 to 0.4 μm. Chucks with different roughnesses of the top surface $64_U$ can be tested and the one that reduces the temperature difference ΔT between the chuck surface and the substrate can be used. For example, a chuck surface roughness that minimizes the temperature difference or is within 5 percent, 2 percent or 1 percent of the minimum can be selected. The chucks should be tested at the same power setting, and the temperatures of the wafer and chuck may be measured using, for example, thermocouples or fluoroscopic temperature sensors. In general, one does not need to find and know α, or even λ, as long as one knows that the heat transfer coefficient $h_g$ increases (e.g. temperature difference ΔT decreases). Changing the gas would, in general, require that the exercise be repeated, and a different roughness may be chosen. The chuck top surface may be ground with the appropriate grit size to obtain the desired roughness.

Gas 94 supplied by gas source 86 may be helium or argon, or have an atomic or molecular weight greater than that of helium or argon, or be a mixture of gasses. Examples of such atomic gases include noble gases neon, argon, krypton, and xenon. Examples of such molecular gases include those typically used in etch processes, such as $C_4F_8$, $SF_6$, as well as $C_5F_8$, $C_2F_6$, etc.

Second Embodiment

Figure 4A:
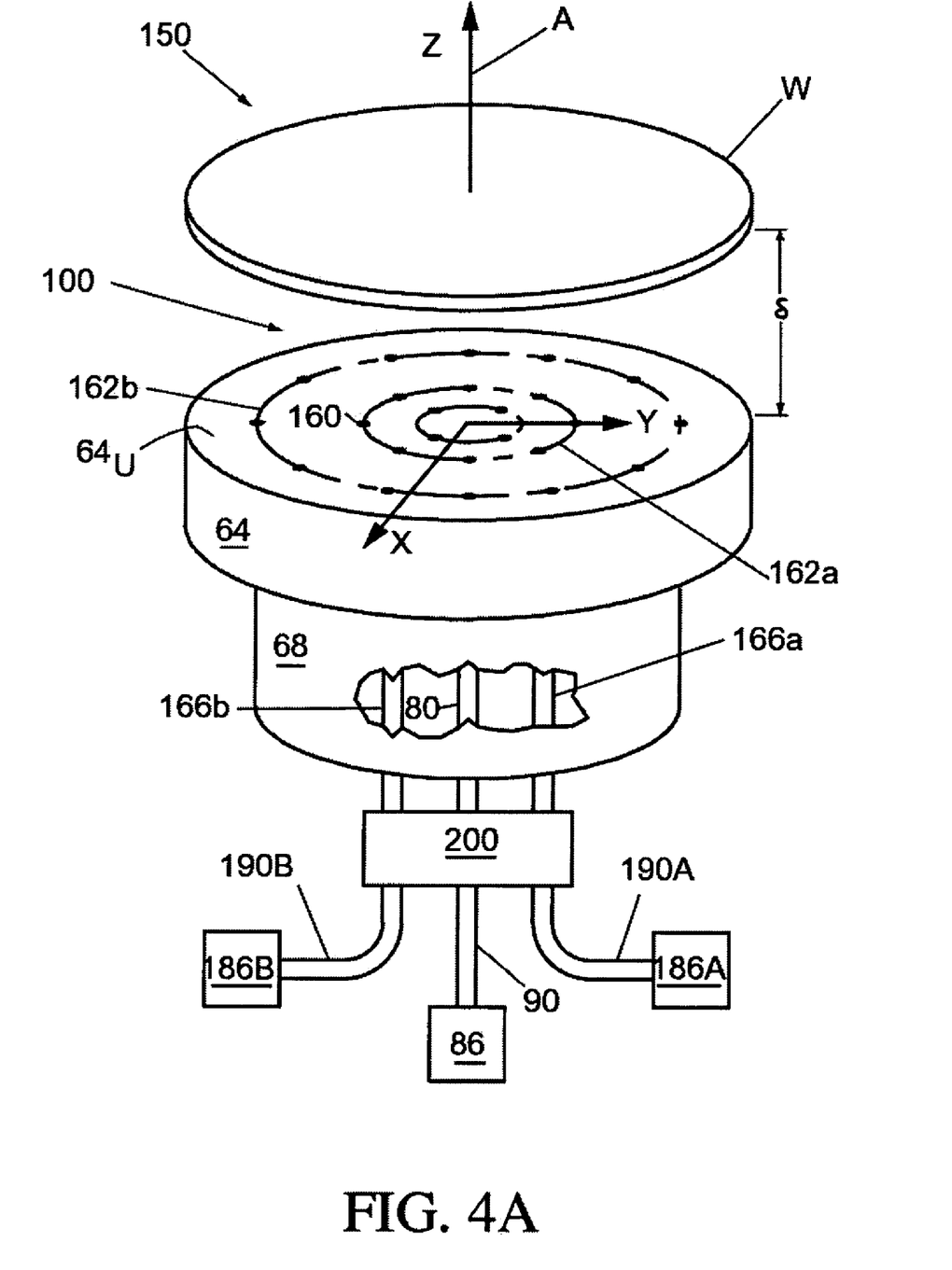
FIG. 4A is a perspective view of the chuck apparatus according to a second aspect of the present invention showing the concentric gas rings comprising a plurality of gas injection holes for providing one or more gases to the chuck upper surface.
Figure 4B:
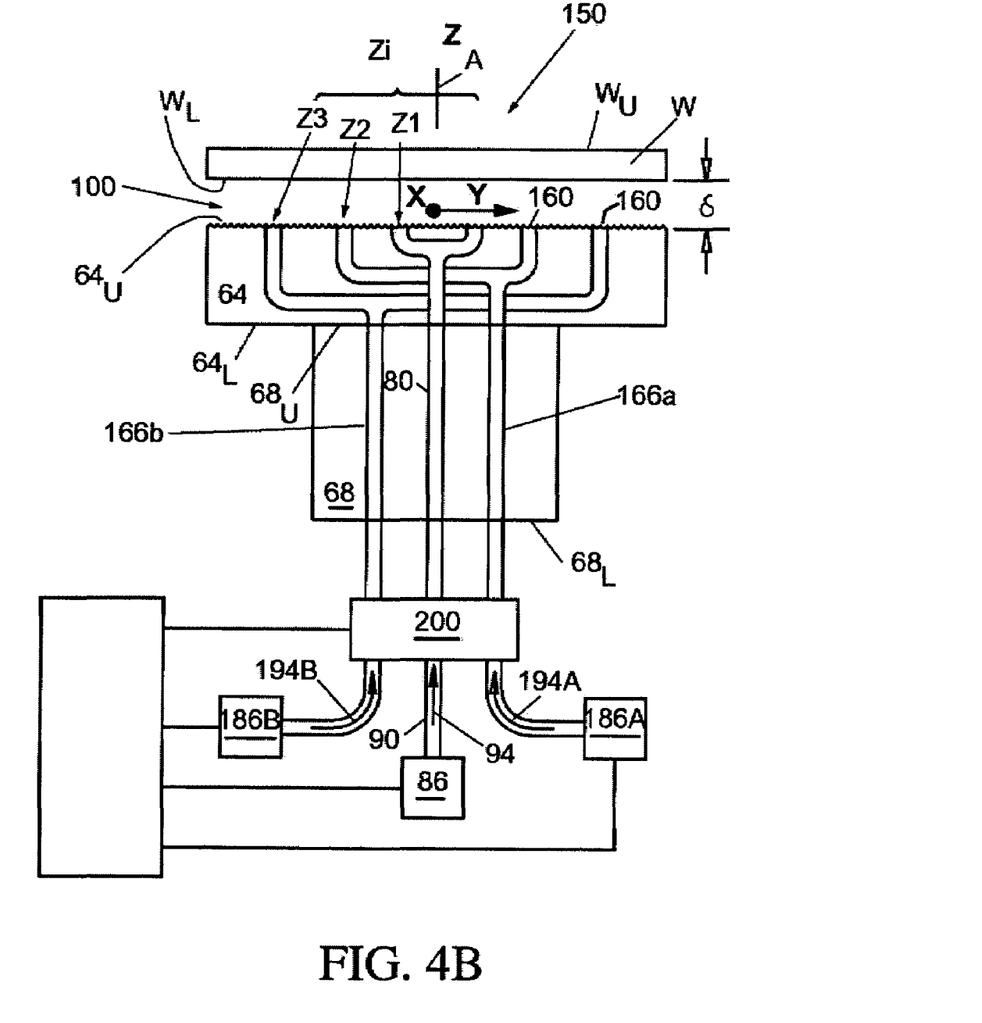
FIG. 4B is a cross-sectional schematic diagram of the chuck apparatus of FIG. 4A, showing a main control unit for dynamically controlling the flow of gas into the gap to control the transfer of heat from the substrate to the chuck body.

With reference now to FIGS. 4A and 4B, there is shown a second chuck apparatus 150 for supporting a substrate W as a second embodiment of the present invention. A x-y plane in gap 100 parallel to surface $64_U$ is shown for the sake of orientation. Chuck apparatus 150 is essentially the same as chuck apparatus 50 described above, except that chuck apparatus 150 includes some additional features, described below. Those elements in chuck apparatus 150 that are the same as in chuck apparatus 50 are given the same reference numbers. Also, chuck apparatus 150 is in a low-pressure environment (region 56) as well, though chamber 54 is not shown in FIGS. 4A and 4B.

Thus, chuck apparatus 150 includes the same elements as chuck 50, and further includes a plurality of gas injection holes 160 on upper surface $64_U$ arranged in concentric gas rings 162a and 162b. Alternatively, holes 160 may be arranged as rays emanating from the center of the chuck. Each concentric gas ring 162a, 162b is in pneumatic communication with a corresponding gas ring conduit 166a and 166b connecting upper surface $64_U$ and lower surface $68_L$. Thus, gas injection holes 160 are the openings at one end of conduits 166a and 166b at surface $64_U$. Though two concentric gas rings and two corresponding gas conduits are shown for the sake of illustration, in practice one or more such concentric gas rings and gas conduits can be employed.

Chuck apparatus 150 additionally includes secondary gas sources 186A and 186B (i.e., second and third gas sources, where gas source 86 is the first or primary gas source) pneumatically connected to corresponding gas conduits 166a and 166b via respective gas supply lines 190A and 190B, for supplying second and third gases 194A and 194B to upper surface $64_U$ through gas injection holes 160. Thus, upper surface $64_U$ receives gas 94 from first gas source 86, second gas 194A from gas source 186A, and third gas 194B from third gas source 186B. Second and third gases 194A and 194B may be helium or argon, may each have an average atomic/molecular weight greater than helium or argon, or may be a mixture of gases.

With continuing reference to FIGS. 4A and 4B, chuck apparatus 150 may include a multi-channel gas mixer 200 connected to some or all of gas sources 86, 186A and 186B, for supplying to upper surface $64_U$ through conduits 80, 166a and 166b, one or more different gas mixtures. This allows chuck apparatus 150 to have different volume zones $Z_i$ (e.g., $Z_1$, $Z_2$, $Z_3$) within gap 100, wherein the ratios $(k\alpha/\lambda)_i$ differ due to the introduction of different compositions of gas mixtures into gap 100 in the different zones. The configuration of chuck apparatus 150 thus allows for spatially varying the heat transfer coefficient in the x-y directions within gap 100, thereby providing a way of controlling the temperature uniformity of substrate W. This feature is particularly useful for processes that heat the substrate in a spatially varying manner.

In chuck apparatus 150, main control unit 92 is electrically connected to first gas source 86, secondary gas sources 186A and 186B, and to multi-channel gas mixer 200. This allows for dynamic control of the mixing of gases from these gas sources and for controlling the flow of the mixed gas into the gap to control the heat transfer from substrate W to chuck body 60.

Third Embodiment

Figure 5:
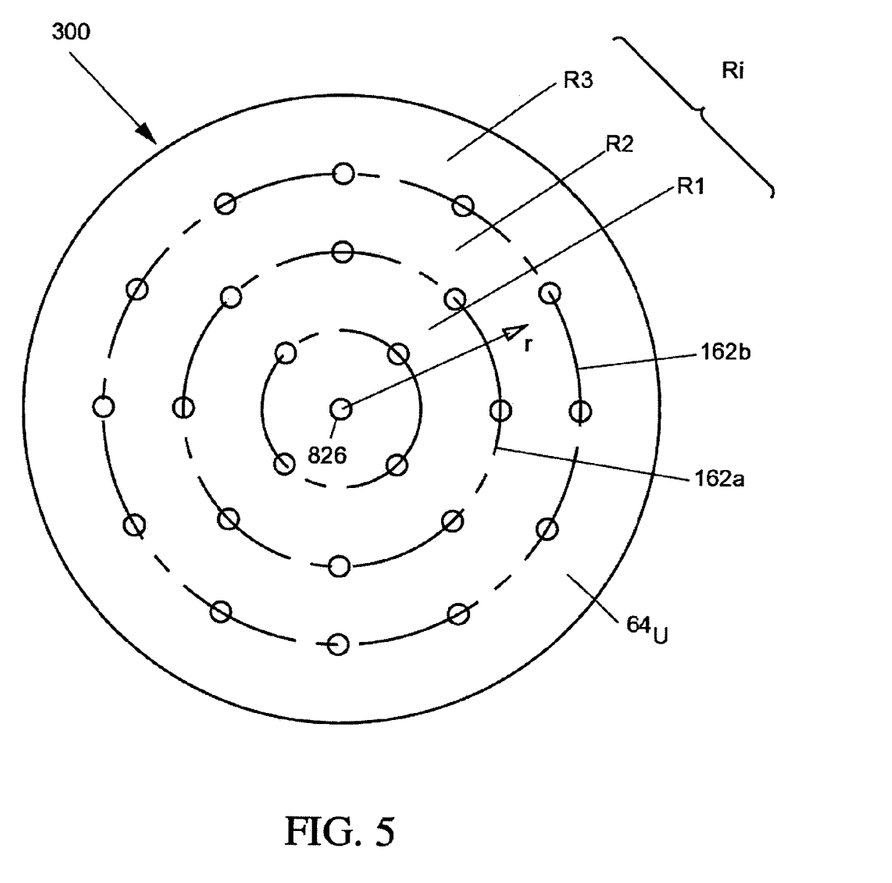
FIG. 5 is a plan view of the upper surface of the chuck body according to a third embodiment of the present invention showing concentric gas rings and regions of different surface roughness.

FIG. 5 is a plan view of chuck apparatus 300 of the present invention. A radial coordinate r is shown for reference. Chuck apparatus 300 is identical in most respects to chuck apparatus 150 described above in connection with FIGS. 4A and 4B. The difference between chuck apparatus 150 and chuck apparatus 300 is that surface $\Gamma_U$ of chuck apparatus 300 has annular regions $R_i$ (i.e., $R_1$, $R_2$ and $R_3$) having different surface roughnesses $\sigma_i$ (e.g., $\sigma_1$, $\sigma_2$ and $\sigma_3$, respectively). Regions $R_1$, $R_2$ and $R_3$ may be defined by concentric gas rings 162a and 162b, each of which comprise a plurality of gas holes 160, as described above in connection with chuck apparatus 150.

In chuck apparatus 300, the ratios $(\alpha/\lambda)_i$ of the accommodation coefficient $\alpha$ to the mean free path $\lambda$ of the gases in different zones $Z_i$ corresponding to regions $R_i$ may be very different due to two factors. The first factor is the different gases injected into different zones $Z_i$ corresponding to regions $R_i$ of upper surface $64_U$. The second factor is the different surface roughnesses $\sigma_i$ regions $R_i$. Exemplary values for surface roughnesses $\sigma_1$, $\sigma_2$ and $\sigma_3$ are an Ra of 2, 8 and 16 μm. Therefore, the heat transfer due to gas gap conduction in zones $Z_i$ may be quite different, even more so than in chuck apparatus 150. Chuck apparatus 300 thus provides a more versatile system for cooling substrate W and for controlling substrate temperature uniformity. Greater or fewer zones $Z_i$ can be formed, depending on the need for controlling the temperature uniformity.

Multi-channel gas mixer 200 in the second and third embodiments is used to mix two or more component gases from two or more gases from primary gas source 86 and secondary gas sources 186A and 186B into gas mixtures of varying composition. It will be apparent to one skilled in the art that the use of three gasses sources as described above and shown in FIGS. 4A and 4B is for illustration, and that any reasonable number of gas sources can be connected to gas mixer 200 to achieve a wide variety of gas mixtures. In the present invention, two or more different gases with different values of $k\alpha/\lambda$ may be used so that a gas mixture having a wide range of $k\alpha/\lambda$, and thus a wide range of heat transfer coefficients, can be achieved. For example, helium might serve as a first mixing gas, while a heavy process gas like $C_4F_8$ or $SF_6$, or a heavy inert atomic gas such as xenon, might serve as a second mixing gas. Multi-channel gas mixer 200 can then provide mixtures of the two (or more) gases that have a heat transfer coefficient between a low value (e.g., for pure helium gas) and a high value (e.g. for the pure heavy gas).

The roughness of surface $64_U$ in chuck apparatus 150 and the roughness of surface $64_U$ in regions $R_i$ is not easily changed during processing of substrate W. If the range of heat transfer coefficients obtainable with the surface roughness values ($\sigma$ or $\sigma_i$) and the range of gas mixture compositions is not sufficiently wide, then upper cylindrical portion 64 of chuck body 60 can be replaced with another having a different surface roughness $\sigma$ or $\sigma_i$. This allows for a different range of heat transfer coefficients to be obtained.

With either of the last two embodiments, the different regions $R_i$ may be of a shape that corresponds to the heating of the substrate. For example, where the substrate process induces radial heating of the substrate, annular regions $R_i$ such as described may prove most advantageous. However, other shapes can be used, particularly where the substrate heating distribution is non-radial. Also, as mentioned above, surface roughness $\sigma$ can be a smooth function of position (i.e., σ(x,y) or σ(r), where r is the radial measure $(x^2+y^2)^{1/2}$) so that there are no discrete regions R, but one region R where σ varies continuously.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents should be considered as falling within the spirit and scope of the invention as claimed.

What is claimed is:

1. A chuck apparatus for supporting a substrate having an upper and lower surface for facilitating heat transfer away from the substrate during processing of the upper surface of the substrate, comprising:
 a chuck body having an outer edge and a rough upper surface adjacent to which is arranged the substrate lower surface so as to form a gap therebetween; and
 a gas conduit passing through said chuck body and having a first end open to said rough upper surface and a second end opposite said first end such that a gas can flow through said conduit into said gap and toward said chuck body outer edge,
 wherein the roughness of the upper surface is selected so that a ratio α/λ is within 5 percent of a maximum value, where α is the accommodation coefficient of the rough upper surface and λ is the mean free path of the gas.

2. The chuck apparatus according to claim 1, wherein the roughness of the rough upper surface is 0.4 μm or greater.

3. The chuck apparatus according to claim 1, wherein the roughness of the rough upper surface is 0.4 to about 10 μm.

4. The chuck apparatus according to claim 1, wherein the roughness of the rough upper surface is about 1 to about 4 μm.

5. The chuck apparatus according to claim 1, wherein the roughness of the rough upper surface is selected so that a ratio α/λ is within 2 percent of a maximum value, where α is the accommodation coefficient of the rough upper surface and λ is the mean free path of the gas.

6. The chuck apparatus according to claim 1, wherein the roughness of the upper surface is selected so that a ratio α/λ is within 1 percent of a maximum value, where α is the accommodation coefficient of the rough upper surface and λ is the mean free path of the gas.

7. The chuck apparatus according to claim 6 wherein the roughness is selected so that the ratio α/λ is a maximum value.

8. The chuck apparatus according to claim 1, wherein the roughness of the rough upper surface is selected so that a temperature difference between the rough upper surface and the substrate is within 5 percent of a minimum.

9. The chuck apparatus according to claim 1, wherein the roughness of the rough upper surface is selected so that a temperature difference between the rough upper surface and the substrate is within 2 percent of a minimum.

10. The chuck apparatus according to claim 1, wherein the roughness of the rough upper surface is selected so that a temperature difference between the rough upper surface and the substrate is within 1 percent of a minimum.

11. The chuck apparatus according to claim 10, wherein the roughness of the rough surface is selected so that the temperature difference is a minimum.

12. The chuck apparatus according to claim 1, further including:
 or more additional gas conduits formed in said chuck body, each having a plurality of first ends terminating at said rough upper surface as gas injection holes arranged in one a more concentric gas rings or other hole patterns, and a second end opposite said plurality of first ends.

13. The chuck apparatus according to claim 12, further including:
 two or more regions of different surface roughness on said rough upper surface.

14. The chuck apparatus according to claim 13, wherein said two or more regions are defined by said concentric gas rings or other hole patterns.

15. The chuck apparatus according to claim 1, wherein the amount of surface roughness changes smoothly across the rough upper surface.

16. The chuck apparatus according to claim 1, further including a first gas source connected to said central gas conduit at said second end.

17. The chuck apparatus according to claim 16, wherein said gas source provides a gas having an atomic or molecular weight that is greater than that of helium.

18. The chuck apparatus according to claim 16, wherein said gas source provides gas having an atomic or molecular weight that is greater than that of argon.

19. The chuck apparatus according to claim 17, wherein said first gas source contains at least one gas from the group of gases comprising: neon, argon, krypton, xenon.

20. The chuck apparatus according to claim 16, further including one or more secondary gas sources connected to said one or more said gas ring, or pattern, conduit second ends.

21. The chuck apparatus according to claim 19, wherein said one or more secondary gas sources contain at least one gas from the group of gases comprising: helium, eon, argon, krypton, xenon.

22. The chuck apparatus according to claim 12, further including:
 two or more gas sources; and
 multi-channel gas mixer connected to said two or more gas sources and to two or more corresponding gas conduits leading to said rough upper surface, for providing a gas mixture comprising gases from said one or more gas sources.

23. The chuck apparatus according to claim 17, further including a main control unit electronically connected to said gas source for dynamically controlling the delivery of gas to said gap.

24. The chuck apparatus according to claim 20, further including a main control unit electronically connected to said first gas source and said one or more secondary gas sources for dynamically controlling the delivery of gas to said gap.

25. The chuck apparatus according to claim 22, further including a main control unit electronically connected to said multi-channel gas mixer for controlling the mixing of gases from said two or more gas sources to form said gas mixture and dynamically controlling the delivery of said gas mixture to said gap.

26. A method of facilitating the transfer of heat from a substrate having a lower surface and an upper surface to a chuck body having a center, an outer edge and an upper surface, in a low-pressure environment, comprising:
 providing the upper surface of the chuck body with a rough upper surface;

forming a gap between the rough upper surface and the substrate lower surface by arranging the substrate adjacent the rough surface; and flowing at least one gas into said gap such that the gas flows towards the outer edge, wherein the roughness of the upper surface of the chuck body is selected so that a ratio $\alpha/\lambda$ is within 5 percent of a maximum value, where $\alpha$ is the accommodation coefficient of the upper surface of the chuck body and $\alpha$ is the mean free path of the gas.

27. The method according to claim 26, wherein said at least one gas has an atomic or molecular weight that is heavier than that of helium.

28. The method according to claim 26, wherein said at least one gas has an antomic or molecular weight that is heavier than that of argon.

29. The method according to claim 26, wherein the amount of surface roughness, the substrate lower surface, the type of gas, and the flow of gas define an accommodation coefficient $\alpha$ and a mean free path $\lambda$ such that the ratio $\alpha/\lambda$ is greater than that of helium.

30. The method according to claim 26, wherein the roughness of the upper surface of the chuck body is 0.4 μm or greater.

31. The method according to claim 26, wherein the roughness of the upper surface of the chuck body is 0.4 to about 10 μm.

32. The method according to claim 26, wherein the roughness of the upper surface of the chuck body is about 1 to about 4 μm.

33. The method according to claim 26, wherein the roughness of the upper surface of the chuck body is selected so that a ratio $\alpha/\lambda$ is within 2 percent of a maximum value, where $\alpha$ is the accommodation coefficient of the upper surface of the chuck body and $\lambda$ is the mean free path of the gas.

34. The method according to claim 26, wherein the roughness of the upper surface of the chuck body is selected so that a ratio $\alpha/\lambda$ is within 1 percent of a maximum value, where $\alpha$ is the accommodation coefficient of the upper surface of the chuck body and $\lambda$ is the mean free path of the gas.

35. The method according to claim 34 wherein the roughness is selected so that the ratio $\alpha/\lambda$ is a maximum value.

36. The method according to claim 26, wherein the roughness of the upper surface of the chuck body is selected so that a temperature difference between the upper surface and the substrate is within 5 percent of a minimum.

37. The method according to claim 26, wherein the roughness of the upper surface of the chuck body is selected so that a temperature difference between the upper surface and the substrate is within 2 percent of a minimum.

38. The method according to claim 26, wherein the roughness of the upper surface of the chuck body is selected so that a temperature difference between the upper surface and the substrate is within 1 percent of a minimum.

39. The method according to claim 38, wherein the roughness of the upper surface of the chuck body is selected so that the temperature difference is a minimum.

40. The method according to claim 26, wherein said providing includes forming on the upper surface of the chuck body a plurality of regions having different amounts of surface roughness.

41. The method according to claim 26, wherein said providing includes forming on the upper surface of the chuck body a roughened surface having an amount of surface roughness that varies as a function of position.

42. The method according to claim 26, wherein said flowing includes introducing two or more different gases into different zones within the gap.

43. The method according to claim 26, wherein said flowing includes dynamically controlling the flow of the at least one gas to control the amount of heat transfer.

44. The method according to claim 42, wherein said flowing includes dynamically controlling the flow of the two or more different gases to control the amount of heat transfer.

45. The method according to claim 26, further including, after said flowing, replacing the upper surface of the chuck body with a new upper surface having a second amount of surface roughness.

46. The method according to claim 40, further including, after said flowing, replacing the upper surface of the chuck body with a new upper surface having a second plurality of regions having different amounts of surface roughness.

47. The method according to claim 26, further including, during or after said flowing:

processing the upper surface of the substrate.

48. The method according to claim 47, wherein the processing includes subjecting the upper surface of the substrate to a plasma.

49. A chuck apparatus for supporting a substrate having an upper and lower surface for facilitating heat transfer away from the substrate during processing of the upper surface of the substrate, comprising:

a chuck body having an outer edge and a rough upper surface adjacent to which is arranged the substrate lower surface so as to form a gap therebetween; and a gas conduit passing through said chuck body and having a first end open to said rough upper surface and a second end opposite said first end such that a gas can flow through said conduit into said gap and toward said chuck body outer edge, wherein the roughness of the rough upper surface is selected so that a temperature difference between the rough upper surface and the substrate is within 5 percent of a minimum.

50. The chuck apparatus according to claim 49, further including:

one or more additional gas conduits formed in said chuck body, each having a plurality of first ends terminating at said rough upper surface as gas injection holes arranged in one more concentric gas rings or other hole patterns, and a second end opposite said plurality of first ends.

51. The chuck apparatus according to claim 50, further including:

two or more gas sources; and a multi-channel gas mixer connected to said two or more gas sources and two or more corresponding gas conduits leading to said rough upper surface, for providing a gas mixture comprising gases from said one or more gas sources.

52. A method of facilitating the transfer of heat from a substrate having a lower surface and an upper surface to a chuck body having a center, an outer edge and an upper surface, in a low-pressure environment, comprising:

providing the upper surface of the chuck body with a rough upper surface;

forming a gap between the rough upper surface and the substrate lower surface by arranging the substrate adjacent the rough surface; and flowing at least one gas into said gap such that the gas flows towards the outer edge, wherein the roughness of the rough upper surface is selected so that a temperature different between the rough upper surface and the substrate is within 5 percent of a minimum.

53. The method according to claim 52, wherein said providing includes forming on the upper surface of the chuck body a roughened surface having an amount of surface roughness that varies as a function of position.

54. The method according to claim 52, wherein said flowing includes dynamically controlling the flow of the at least one gas to control the amount of heat transfer.

* * * * *